(12) United States Patent
Scholtz et al.

(10) Patent No.: US 9,999,118 B2
(45) Date of Patent: Jun. 12, 2018

(54) PLASMA DENSIFICATION METHOD

(71) Applicant: Scholtz E Fontana Consultoria LTDA-ME, Joinville, Santa Catarina (BR)

(72) Inventors: Juliano Sadi Scholtz, Santa Catarina (BR); Luis Cesar Fontana, Santa Catarina (BR)

(73) Assignee: Scholtz E Fontana Consultoria LTDA-ME, Joinville, Santa Catarina (BR)

( * ) Notice: Subject to any disclaimer, the term of this patent is extended or adjusted under 35 U.S.C. 154(b) by 0 days. days.

(21) Appl. No.: 15/469,636

(22) Filed: Mar. 27, 2017

(65) Prior Publication Data

US 2017/0280548 A1    Sep. 28, 2017

(30) Foreign Application Priority Data

Mar. 28, 2016   (BR) .......................... 1020160067863

(51) Int. Cl.

| | |
|---|---|
| *H01J 7/24* | (2006.01) |
| *H05H 1/46* | (2006.01) |
| *H01J 37/32* | (2006.01) |
| *H05H 1/24* | (2006.01) |
| *H01J 37/05* | (2006.01) |

(52) U.S. Cl.
CPC ......... *H05H 1/46* (2013.01); *H01J 37/32009* (2013.01); *H01J 37/05* (2013.01); *H01J 2237/0473* (2013.01); *H05H 1/24* (2013.01)

(58) Field of Classification Search
CPC .......................... H01J 37/05; H01J 2237/0473

USPC ........................................ 315/111.81, 111.91
See application file for complete search history.

(56) References Cited

U.S. PATENT DOCUMENTS

| 4,423,354 | A  | * | 12/1983 | Kegelman ............... | H01J 29/46 315/12.1 |
|---|---|---|---|---|---|
| 5,132,597 | A  | * | 7/1992 | Goebel ................. | H01J 17/063 313/161 |
| 7,808,184 | B2 | * | 10/2010 | Chistyakov ............. | C23C 14/35 315/111.21 |
| 7,898,183 | B2 | * | 3/2011 | Chistyakov ....... | H01J 37/32009 315/111.21 |
| 8,125,155 | B2 | * | 2/2012 | Chistyakov ............. | C23C 14/35 315/111.21 |
| 9,123,508 | B2 | * | 9/2015 | Chistyakov ....... | H01J 37/32009 |
| 2004/0100200 | A1 | * | 5/2004 | Takeuchi ................ | G09G 3/22 315/169.3 |

* cited by examiner

*Primary Examiner* — Thuy Vinh Tran
(74) *Attorney, Agent, or Firm* — Dinsmore & Shohl LLP (57) ABSTRACT

The plasma is formed between electrodes to be energized from an electric power source, containing a partially ionized mass having a luminescence region including neutral atoms (NA), primary electrons (PE), secondary electrons (SE), and ions. The method comprises the steps of: accelerating the primary electrons (PE) toward one of said electrodes polarized by a positive high voltage pulse impacting primary electrons (PE) against said electrode and ejecting secondary electrons (SE) from it; subsequently, accelerating the secondary electrons (SE) toward the luminescence region by polarization of said electrode by a negative voltage to collide the secondary electrons with neutral atoms (NA) and producing positive ions (PI) and derived electrons (DE); repeating the previous steps in order to obtain a steady state plasma with a desired degree of ionization.

20 Claims, 4 Drawing Sheets

PLASMA DENSIFICATION METHOD

CROSS-REFERENCE TO RELATED APPLICATIONS

This Application claims priority for Application BR1020160067863 filed on Mar. 28, 2016 in Brazil.

FIELD OF THE INVENTION

This invention relates the generation and control of the physical state of plasma for different applications. More specifically, the invention describes a method for better controlling and amplifying the degree of ionization of the plasma formed within an electrical discharge chamber provided with two or more electrodes, where one of them may be the chamber wall. The method uses the control of electric voltage pulses for generating a gain in the emission of electrons from the electrodes.

BACKGROUND OF THE INVENTION

There are several ways to generate a plasma state, and they can be classified into two large areas: "Capacitively Coupled Plasma (CCPs)" and "Inductively Coupled Plasma (ICPs)". The plasma sub-classifications depend on the waveforms of the applied voltage, among which can be listed the following: RF (radio frequency); DC and Pulsed-DC (DC: Direct Current); Microwaves and Pulsed-AC (AC: Alternating Current).

The technological applications of plasma cover several currently well-established areas and industrial processes, such as: surface treatment by chemical activation and diffusion of atoms (for example: nitriding, cementation, carburization, boriding and oxidation); sintering of compacted powder parts; thin film deposition by sputtering (cathodic bombardment); surface cleaning; physicochemical functionalization or activation of surfaces; polymerization by plasma; polluting gas treatment; surface sterilization, environment, tools and gas treatment; etching in the field of microelectronics; and surface treatment for obtaining a controlled roughness on a micrometric or nanometric scale.

Through a controlled process, it is possible to obtain surfaces with high catalytic power; photoactive surfaces; self-cleaning surfaces; bioactive surfaces for implant applications; surfaces with high wettability and great adhesion power; functionalization of polymer surfaces; functionalization of nanoparticles surfaces such as carbon nanotubes; synthesis of nanometric and micrometric particles; heat treatment of surfaces and parts; cleaning of parts, mainly for the elimination of grease or fat, oils, water vapors and oxides from the surface; power source for the heating of parts; breakdown of polluting gas molecules as VOCs (Volatile Organic Compounds), NOx (Nitrogen Oxides), SOx (Sulfur Oxides), particulates, agrochemicals, combustion products, etc.; incineration of garbage, including hospital waste; ore reduction; biological applications such as seed treatment for better preservation and activation of germination; recycling of parts composed of two or more materials such as polymer and metal; water remediation; catalytic gas reform; and cracking of oil and other multi-atomic molecules.

For generating a plasma state with capacitive coupling, a power source is used to create an electric field between an anode and a cathode, immersed in a gas, with a pressure typically between $10^{-3}$ Torr up to 10 Torr.

Very popular applications of plasma are for surface treatment of materials (nitriding, carburization, oxidation, etc.) and deposition of films by cathodic spray (sputtering). A limitation of the process in these types of applications is the voltaic arc that may occur during the conventional process. These arcs can damage the parts and the electric power supply. These problems with voltaic arcs have been gradually solved in recent decades through different strategies, where the most known of them uses pulsed and/or bipolar polarization between the anode and the cathode. This forces the arcs to be suppressed when the pulse changes polarity, that is, when the electrode changes from anode to cathode (or during the rest time between two adjacent negative pulses of the voltage, if the voltage has zero value in that interval).

In processes that apply high frequency voltages, for example, RF (radio frequency), ions (in addition to electrons) can respond to the alternating cycle of applied voltage, both in the electrodes and in the plasma volume, because a DC level (Direct Current) is established in addition to the AC signal (Alternating Current).

Specifically for the case of film deposition, the introduction of pulsed magnetron sputtering (PMS) allowed the deposition of films over conductive or dielectric targets (using a reactive working gas) with good efficiency in the suppression of voltaic arcs.

The cathodic sputtering pulsed mode can occur basically in two ways: unipolar, where the negative potential is periodically applied to the sputtering target, with rest periods between the pulses, and bipolar, where the negative potential is periodically applied to the sputtering target, but with positive potential intervals interspersed.

Figure 1:
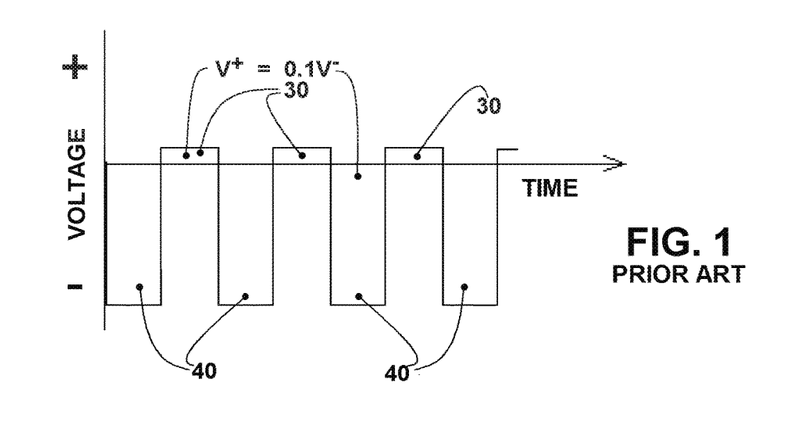
FIG. 1 is a graph illustrating a typical voltage waveform of commercially known power supply sources for asymmetrical bipolar mode, for the generation of plasma applied to film deposition by sputtering, processes of surface treatment and etching, among others.

The most common mode of operation is the asymmetrical bipolar one, where during the positive phase (also known as "pulse-off"), the applied voltage module has a value equivalent to approximately 10% of the applied voltage module in the negative phase (also known as "pulse-on"). Since the negative peak voltage is on the order of a few hundred volts, the positive pulses do not exceed a few tens of volts. A typical voltage waveform from plasma generating sources for asymmetrical bipolar mode is shown in FIG. 1. In this case, each low intensity positive pulse has the objective of suppressing the voltaic arcs, which is not efficient, however, for the generation of secondary electrons.

During the "pulse-on" phase (negative polarization), an ion current reaches the electrode (in this case, the target) which normally produces the cathodic sputtering or ion implantation or surface adsorption and neutralization. However, in this process, it is possible to form small dielectric islands (electrical insulation) on the surface of the target. These islands, also known as "poisoned" regions, are usually formed by chemical reactions of atoms (or molecules) from the working gas with the surface of the target. Electric charges accumulate on these dielectric islands during this period of negative polarization, due to the accumulation of ions (positive electric charges) coming from the plasma.

Then during the "pulse-off" phase (or with a positive voltage on the order of 10% in modulus of the negative pulse voltage) an electron current (negative charge) from the plasma to the target occurs, which can neutralize the accumulated static charges in the poisoned regions, where arcs could occur if they were not neutralized. Thus, the formation of arcs can be avoided or, if the rupture of the dielectric barrier of the medium has already occurred, the arc can be suppressed during the positive pulse.

In the plasma processes of nitriding, oxidation, carburizing, etc., similar phenomena of electric charge accumulation occur in regions insulated from the part under treatment, which potentially generate voltaic arcs when the dielectric constant of the medium is ruptured. In the same way as described above, the use of asymmetric bipolar pulses in the plasma can suppress these voltaic arcs. In other situations, the possible instabilities that sometimes appear in the plasma can be suppressed by the application of this type of pulse.

Another relevant aspect is the quantity called "plasma density" (also known as "electron density", that is, the number of free electrons per unit volume). The plasma density is measured by the fraction of ions or electrons generated in the medium, relative to the neutral atoms. In the DC continuum or pulsed plasmas, this fraction, in general, is less than 0.01. This small fraction of ions already provides good electrical conductivity to the gaseous medium, promoting a series of physical-chemical phenomena that confer the characteristics of plasma in the medium. However, the higher the plasma density, the greater the heat and the reactivity in the medium. The plasma density depends on the rate of ionization (ion production per unit time), which depends on various parameters of the plasma such as: working gas pressure, nature of the gas, applied voltage, electrode material, distance between the anode and cathode, and system geometry. A particularly important factor for plasma density is the secondary electron emission from the electrodes.

Secondary electrons are those electrons emitted by the electrodes of the medium in which the electric discharge occurs in the gas (plasma in the capacitive configuration). The emission of these secondary electrons occurs mainly due to the bombardment of the electrode surface by electrically charged plasma particles.

Secondary electrons are responsible for the maintenance of plasma, i.e., for the transport of energy supplied by the power supply to the plasma. The secondary electrons emitted from the cathode pass through the cathode sheath, where they acquire kinetic energy proportional to the potential difference in the sheath. These electrons are accelerated toward the luminescent region of the plasma (ionized mass). About 90% of the electrical voltage applied to the process decays in the region of the sheath (typically on the order of hundreds of volts). Therefore, these secondary electrons reach the luminescent region of the plasma with high energy, which dissipates through processes of ionization of neutral atoms, transfer of energy to the local population of cold electrons, excitation of particles, heating and dissociation of atoms and molecules of the working gas (for example, noble gases and molecular gases). Therefore, the control in the generation of the secondary electrons is an important tool for the control, generation and maintenance of the plasma state.

In continuous DC or pulsed DC plasmas, the secondary electrons are produced mainly by ionic bombardment in the cathode. However, the yield of the secondary electrons produced by ions that collide with the cathode is very low (typically 0.1 or less for applied voltage potentials on the order of hundreds of volts).

On the other hand, the bombardment of the target by electrons has greater efficiency in the emission of secondary electrons. Therefore, if the target (electrode) is bombarded with electrons, it will be possible to increase the plasma density as a consequence of the higher emission of secondary electrons. Table 1 shows some comparative values of yields in secondary electron emission due to electronic bombardment ($\delta$) and ionic bombardment ($\gamma$), for different materials and applied voltages. It can be observed that the yield in the secondary electron emission reaches values greater than 1, this is, it can be more than ten times the yield due to the ionic bombardment. For example, in the case of an Ni target (Table 1), the yield of secondary electron emission is $\delta=1.3$ and $\gamma=0.15$.

TABLE 1

Efficiency in the emission of secondary electrons due to electronic bombardment ($\delta = e_{secondary}/e_{primary}$) and ionic bombardment ($\gamma = e_{secondary}/ions_{Argon}$) for several target materials.

| Element | Efficiency "$\delta$" | | Efficiency "$\gamma$" | |
|---|---|---|---|---|
| | $\delta_{max}$ (e/e)$^{(ref)}$ | $V_{p(max)}$ (V) | $\gamma_{max}$ (e/i)$^{(ref)}$ | $V_{n(min)}$ (V) |
| Ag | 1.50 | 800[1] | | |
| Al | 1.00 | 300[2] | | |
| Au | 1.46 | 750[1] | | |
| B  | 1.20 | 150[3] | | |
| Bi | 1.15 | 550[4] | | |
| C  | 1.00 | 300[2] | | |
| Cd | 1.10 | 400[5] | | |
| Co | 1.20 | 700[6] | 0.400 | −700[13] |
| Cu | 1.30 | 600[1] | | |
| Fe | 1.30 | 350[1] | | |
| Ge | 1.20 | 400[3] | 0.047 | −1000 |
| Mo | 1.25 | 375[1] | 0.115 | −100[11] |
| Nb | 1.20 | 375[1] | | |
| Ni | 1.30 | 550[1] | 0.150 | −500[13] |
| Pb | 1.10 | 500[4] | | |
| Pd | 1.41 | 500[14] | | |
| Pt | 1.80 | 800[9] | | |
| Si | 1.10 | 250[3] | 0.027 | −100[11] |
| Sn | 1.35 | 500[4] | | |
| Ti | 0.90 | 280[2] | | |
| W  | 1.40 | 700[10] | 0.099 | −1000 |
| Zr | 1.10 | 350[2] | | |

[1](WARNECKE, 1936),
[2](BRUINING, 1954),
[3](KOLLER e BURGESS, 1946),
[4](MOROZOV, 1941),
[5](SUHRMANN e KUNDT, 1943),
[6](WOOLDRIDGE, 1939),
[7](AFANASJEWA e TIMOFEEW, 1944),
[8](FARNSWORTH, 1925),
[9](COPELAND. 1931),
[10](PETRY, 1926) apud (BRUINING, 1954).
[11](KONUMA, 1992) apud (LIEBERMAN and LICHTENBERG, 2005)
[12](HAGSTRUM; TAKEISHI; CARLSTON et al, 1965) apud (CAPMAN, 1980)
[13](ROSTAGNI, 1938; HEALEA and HOUTERMANS, 1940; HILL et al, 1939) apud (ENGEL, 1965).
[14](BRONSTEIN and FRAIMAN, 1969) apud (TOLIAS, 2014).

Source: adapted from (BRUINING, 1954) and (TOLIAS, 2014).

This possibility of increasing (and controlling) the plasma ionization degree, by controlling the emission of secondary electrons, associated with electronic bombardment of the electrode, has not yet been explored technologically.

SUMMARY OF THE INVENTION

Due to the limitations of the hitherto known methods for increasing and controlling the plasma ionization rate, the general objective of the present invention is to provide a method of plasma densification (i.e., higher degree of ionization) by means of increasing the emission of secondary electrons using a periodic electronic bombardment of the electrode, thus achieving several benefits such as: greater control in the heating of the plasma, allowing a significant increase in the temperature of the plasma; possibility of obtaining plasma over a wide range of pressure of the working gas; greater plasma stability, with suppression of voltaic arcs; control in the volume of the luminescent region of the plasma; possibility of generating plasma with low negative voltage in the cathode, on the order of tens or hundreds of volts; better plasma coupling to the part geometry; higher energy transfer rate from the electrodes to the plasma, among others, making the plasma generation very flexible, from the point of view of choice of process parameters and greatly increasing the possibilities of technological applications.

The above purpose is achieved with a plasma densification method, formed between electrodes energized from an electric power source, said plasma containing: an ionized mass having a region of luminescence and including neutral atoms of an ionizable fluid, primary electrons, positive ions and possible negative ions.

According to the invention, the method comprises the steps of: accelerating the primary electrons contained in the gas or in the ionized mass toward the surface of one of said electrodes by the polarization of said electrode by means of a short positive bias pulse and high voltage, during a sufficient time for producing the impact of the primary electrons, or at least part of them, against the surface of said electrode and from this ejecting secondary electrons; accelerating the secondary electrons and any other electrons in the vicinity of said electrode towards the luminescence region by polarizing said electrode by means of a longer negative pulse, smaller in voltage amplitude in relation to the positive one, with sufficient potential to collide the electrons with neutral atoms and producing positive ions and derived electrons; and continuously repeating the polarization steps of said electrode with positive and negative bias pulses to generate a steady state plasma with a desired degree of plasma density whose degree of ionization is controlled by the intensity and period of the pulses applied. The control of the positive and negative polarization potentials and their respective duration times (the duration of the positive polarization generally being much shorter than the duration of the negative polarization) allows a higher production of secondary electrons and consequently higher densification of the plasma and at the same time avoids the production of voltaic arcs.

BRIEF DESCRIPTION OF THE DRAWINGS

From now on, the invention will be described with references to the accompanying drawings, given by way of example, in which.

DETAILED DESCRIPTION OF THE PREFERRED EMBODIMENTS

As already discussed previously, the present invention relates to a novel method for increasing the density of a plasma, generally, but not necessarily, formed within a normally grounded reaction chamber RC and in which a mass of ionized elements, with a region of luminescence and including neutral atoms NA of an ionizable fluid in the gas or liquid phase and primary electrons PE and positive ions PI formed in an initial phase or in a starting ionization phase of the ionizable fluid within the reaction chamber RC of a suitable reactor (not shown). It should be understood that the electrodes may or not be contained in a reaction chamber RC, and if contained, one of the electrodes may or may not be defined by the wall (not shown) of said reaction chamber RC.

In brief, the method consists of controlling the waveform of the voltage applied to the electrodes and, consequently, controlling the energy and the intensity of secondary electrons SE, that will be described further. The increase in the rate of emission of secondary electrons, formed in one step of the method, allows the control of the generation of positive ions PI in the plasma.

Figure 3:
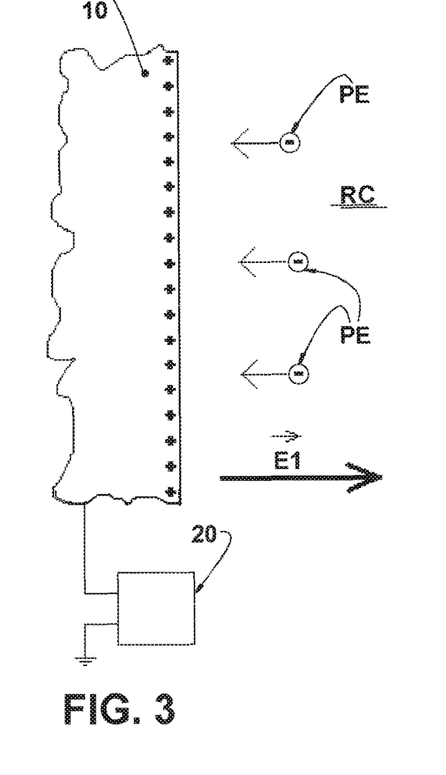
FIG. 3 represents schematically and partially a plasma forming chamber containing a positively polarized electrode for attracting the primary electrons contained in the ionized mass, according to the first step of the method in question.
Figures 4, 4A, 4B:
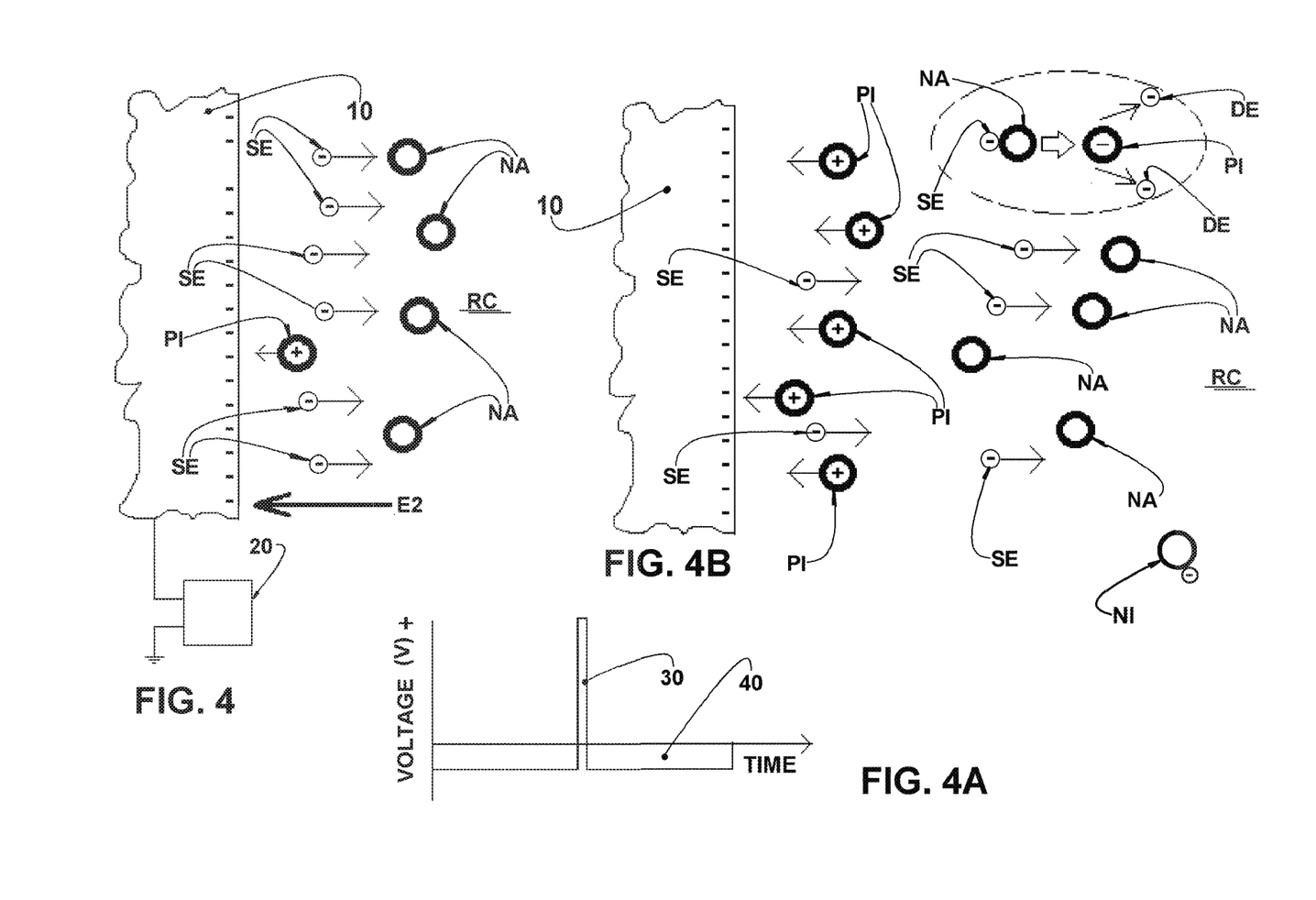
FIG. 4 represents schematically and partially the plasma forming chamber of FIGS. 2 and 3 with the electrode negatively polarized to accelerate the secondary electrons and the other electrons not absorbed by the electrode towards the ionized mass.
FIG. 4A shows the voltage versus time graph in a new and subsequent negative bias of the electrode, as shown in FIG. 4.
FIG. 4B is a schematic representation similar to that of FIG. 4, but illustrating secondary electrons and the primary electrons not absorbed by the electrode, colliding with neutral atoms and producing derived ions and electrons, according to the second step of the method in question.

As schematically illustrated in FIGS. 3 and 4, the method in question aims at the densification of a plasma formed, for example, inside a reaction chamber RC containing an ionized mass defined by a typical region of luminescence and including neutral atoms NA contained in an ionizable fluid and also primary electrons PE and positive ions PI.

Normally, the system is compounded by a grounded reaction chamber RC that houses at least one electrode 10 to be energized from an external electric power source 20 (as indicated in FIG. 4), designed to provide an energizing electrical voltage for the electrode 10 with pulses of high power positive polarization, and negative polarization pulses of low or also high power, depending on the method used.

The method of the invention comprises the steps of: biasing the electrode 10 with an external power source 20 by means of a positive bias pulse 30 with high power and during a first time duration (FIG. 3), positively polarizing the electrode 10 and generating a first electric field E1 that accelerates the primary electrons PE contained in the ionized mass in a direction opposite to the first electric field E1 and towards the surface of the electrode 10.

Figure 3A:
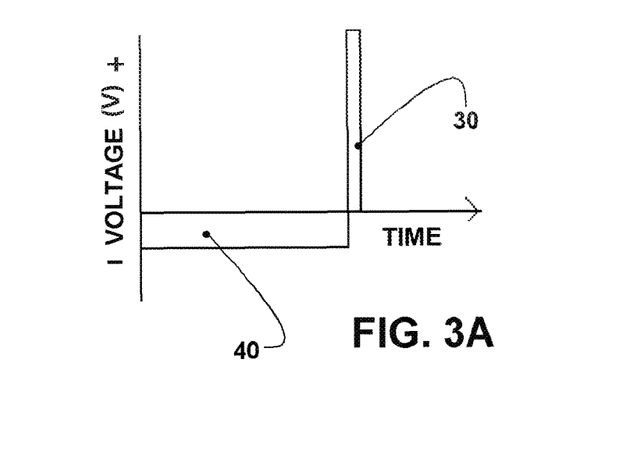
FIG. 3A shows the voltage versus time graph for the positive bias of the electrode, as shown in FIG. 3.
Figure 3B:
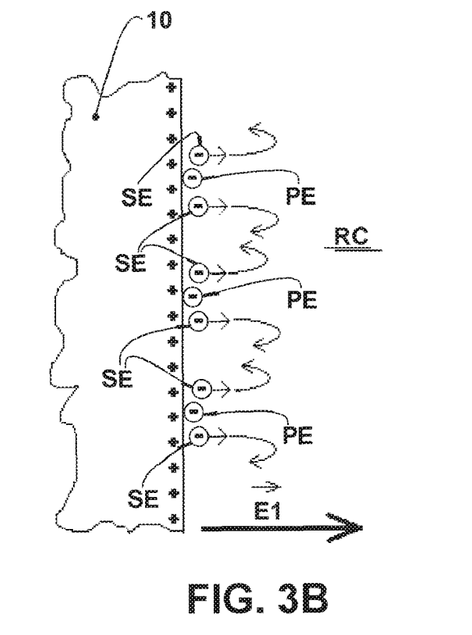
FIG. 3B shows a schematic representation similar to that of FIG. 3, but illustrating primary electrons bombarding and impacting the positively polarized electrode and causing the emission of secondary electrons from the surface of said electrode.

Each primary electron PE accelerated by the positive bias of the electrode 10 and impacting the electrode 10 may eject secondary electrons SE from the surface of the electrode 10, as shown in the sequence of FIGS. 3, 3A and 3B.

After the duration of the positive bias pulse has elapsed, the electrode 10 is biased with a negative bias pulse 40, shown in FIGS. 3A and 4A, for a second time duration, generating a second electric field E2 and accelerating, in the direction of the ionized mass, the secondary electrons SE and the primary electrons PE not absorbed by the electrode 10.

The secondary electrons SE and other electrons located in the vicinity of the electrode 10, and accelerated by the negative polarization of the electrode 10, collide with neutral atoms NA, producing positive ions PI and derived electrons DE, resulting from the ionization process.

The positive and negative bias steps with the respective positive 30 and negative 40 biasing pulses of the electrode 10 are repeated continuously, forming a periodic pulse train. Adjusting the intensity and the period of the respective pulses leads to the achievement of a desired degree of ionization of the ionized mass. The process can start with either a positive pulse or a negative pulse.

Figure 5:
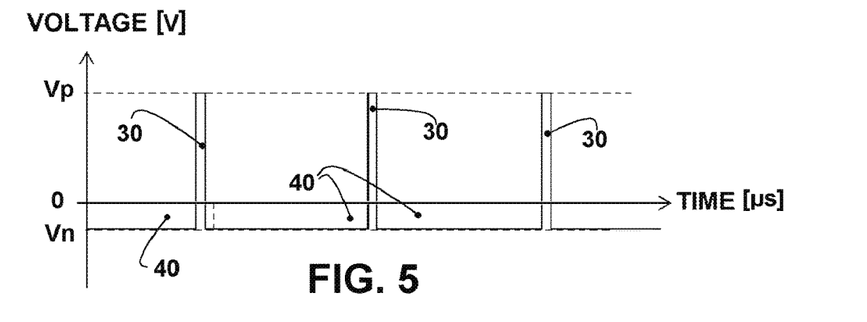
FIG. 5 shows a voltage versus time graph illustrating a sequence of alternating negative and positive bias steps of the electrode, with zero time interval between said steps.
Figure 6:
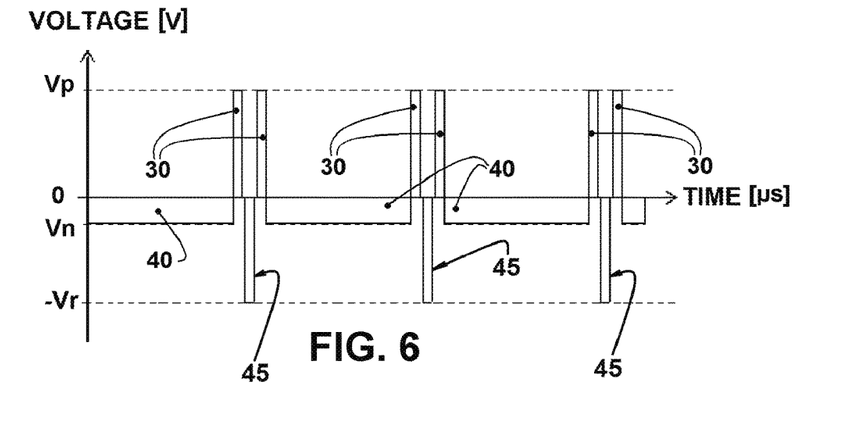
FIG. 6 is a graph similar to that of FIG. 5, but illustrating the provision of two subsequent positive bias pulses and one negative bias pulse between them; and, FIG. 7 is a graph similar to that of FIG. 6, but showing the provision of a zero power time interval between the two subsequent positive bias pulses.
Figure 7:
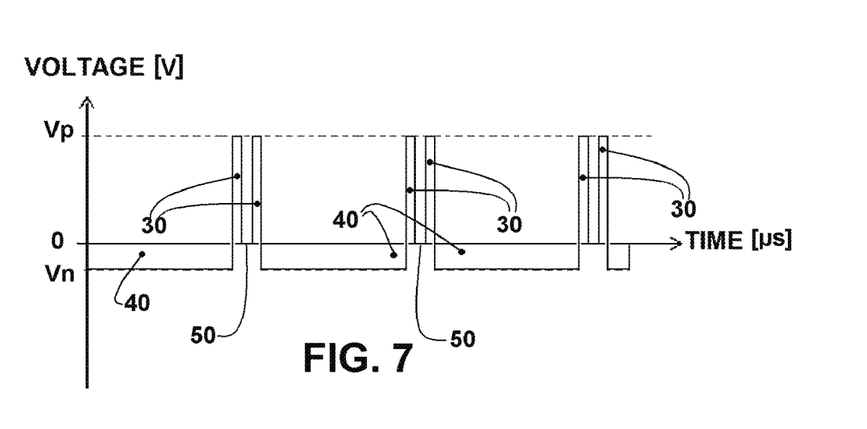

The voltage waveform used for plasma generation is an important aspect for the application of the method in question. The voltage waveform should contain positive bias pulses 30 and negative bias pulses 40, as shown in FIGS. 5, 6 and 7, respectively.

Figures 2, 2A, 2B:
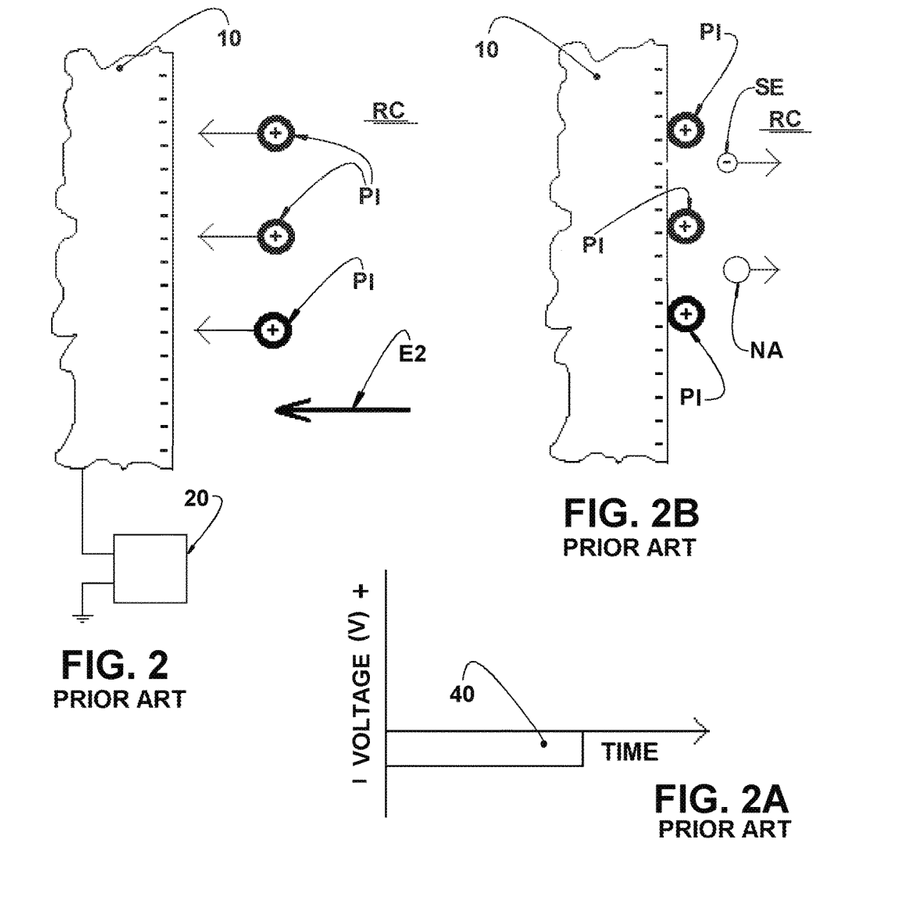
FIG. 2 represents schematically and partially a plasma chamber, containing a negatively polarized electrode for attracting the ions contained in the ionized mass, according to a known technique.
FIG. 2A shows a voltage versus time plot for the negative bias polarization of the electrode, as shown in FIG. 2.
FIG. 2B is a schematic representation similar to that of FIG. 2, but illustrating ions impacting the negatively polarized electrode and causing the emission of secondary electrons and eventually spraying neutral atoms or ions from the surface of said electrode.

FIG. 2 highlights two phenomena that occur during the application of the negative bias pulses 40 on the electrode 10: initially, the positive ions PI from the ionization of the neutral atoms NA of the ionizable fluid are accelerated by the second electric field E2 toward the negative polarized electrode 10. After a period of time, these positive ions PI reach the surface of the electrode 10 and eject secondary electrons SE from that surface. Other phenomena may also occur, such as, for example, the sputtering of neutral atoms NA from the surface of the electrode 10. The emission efficiency of secondary electrons SE by the bombardment of positive ions PI is low ($\gamma$=(secondary electrons SE)/incident positive ions PI), being generally much smaller than the unit, that is, the emission of a secondary electron SE occurs (statistically) after the incidence of several positive ions PI. In general, the value of $\gamma$ varies from 0.01 up to 0.5, depending on the energy and mass of the ions, the nature of the plasma's neutral atoms NA, the physicochemical properties of the electrode 10, in addition to its surface temperature.

FIG. 4A shows a voltage versus time plot for the negative bias of the electrode 10, as shown in FIGS. 4 and 4B.

FIG. 3B shows the time interval subsequent to that of FIG. 3 in which the electrode 10 is biased by a short high power positive pulse 30. During this positive bias pulse 30, an electric field E1 is generated, with direction pointing out of the electrode 10. This positive bias pulse 30 has a short duration, since the objective, at this moment, is to bombard the electrode 10 with primary electrons PE and any other electrons that are under the influence of the electric field generated. As electrons have very small mass (compared to the mass of the ions), this time is sufficient to accelerate the primary electrons PE and any other electrons in the direction of the electrode 10 (in the opposite direction of the electric field E1).

At the initial instants of this positive polarization pulse 30, the primary electrons PE and any other electrons near the electrode 10 reach the surface of the electrode 10, with sufficient energy for ejecting secondary electrons SE (see FIGS. 3, 3A and 3B). Secondary electron emission SE, due to the electronic bombardment of the electrode 10, is very efficient, and may have a d yield greater than 1, as can be seen in Table 1. This yield is defined as: d=(emitted secondary electrons SE)/(incident electrons).

During this short, high power, positive bias pulse 30 the secondary electrons SE initially move away from the surface of the electrode 10 and then tend to return to the surface, as shown by the curved arrows in FIG. 3B. This deceleration occurs due to the performance of the first electric field E1 on these secondary electrons SE. In a short period of time, typically in the range of nanoseconds up to microseconds, this process (emission and re-absorption of secondary electrons SE) is established on the electrode 10, with secondary electrons SE being emitted and reabsorbed by the surface of the electrode 10. These reabsorbed secondary electrons may also produce more secondary electrons from the electrode surface, if they have enough energy to do so. Also, within this interval of time, there is the possibility of some secondary electrons SE reaching the luminescent region of the plasma.

When the polarization is reversed by applying a negative bias pulse 40 to the electrode 10, as shown in FIGS. 4, 4A and 4B, the second electric field E2 reverses in direction with respect to the first electric field E1 and the electrons (both the secondary electrons SE and the primary electrons PE that are in the vicinity of the electrode 10) are accelerated away from the surface of the electrode 10. In the first moments of time, in this new polarization the electrons emitted from the electrode 10, and other electrons in the vicinity, are accelerated in the opposite direction to the second electric field E2, towards the plasma's luminescent region. During the application of the negative pulse, the positive ions PI (already existing and/or produced in the ionized mass) near the electrode are accelerated in the same direction of the second electric field E2, that is, from the plasma's luminescent region to the electrode 10. Similarly, but in the opposite direction, the eventual negative ions NI formed in the process are accelerated by the second electric field E2, from the electrode 10 to the plasma's luminescent region. Neutral atoms NA of the ionizable fluid (e.g., gas) do not undergo any force due to the electric field, since they are electrically neutral.

The secondary electron SE population, (amplified by electronic bombardment during each immediately preceding positive bias pulse 30) and other electrons located in the vicinity of the electrode 10, reach the luminescent region of the plasma with high speed (due to the acceleration carried out by the second electric field E2) and collide with the neutral atoms NA of the ionizable mass. In this event, the accelerated and colliding electrons (secondary electron SE and eventual primary electron PE) can remove derived electrons DE from these neutral atoms NA and generate new positive ions PI, as shown in FIG. 4B and, thus, significantly increasing the population of positive ions PI in the plasma.

Another effect caused by the acceleration of the secondary electrons SE, which reach the luminescent region of the plasma, is the heating (increase of kinetic energy) of the primary electrons PE already present in the plasma. This heating is by "collision" (coulombian electrical interaction) between these electrons. A portion of these electrons can acquire energy greater than the ionization potential of the neutral atoms NA and thus increase the production of positive ions PI in the plasma in subsequent collisions with neutral atoms.

Since the number of secondary electrons SE is amplified due to the positive bias pulse 30 applied in the previous step, the probability of generating positive ions PI in the plasma becomes very large. In this way, the density of positive ions PI in the plasma increases significantly, being able to reach values up to tens of times greater than the ionic density obtained in plasmas generated by traditional sources of continuous DC or pulsed DC voltages, with similar waveform, for example, to that shown in the FIG. 1 graph.

As previously mentioned, the voltage waveform should contain positive bias pulses 30 and negative bias pulses 40, as shown in FIGS. 5, 6 and 7, respectively and defined below:

1—Positive bias pulses 30, short and with high power (with voltage on the order of hundreds or thousands of volts, of short duration, on the order of nanoseconds up to microseconds), periodic, interspersed with negative bias pulses 40 (with a voltage ranging from tens up to hundreds of volts, or thousands of volts), or with time intervals with zero voltage, and with complementary duration to the previous period (see FIG. 5). In this form of operation, during the negative bias pulses 40, the positive ions PI are accelerated towards the electrode 10, whereas the electrons (both secondary electrons and other electrons located near the electrode 10) are accelerated in the opposite direction, promoting ionization of neutral atoms NA in the luminescent region, that is, producing positive ions in the plasma;

2—A sequence of at least two short positive bias pulses Vp 30 between which a reverse negative bias pulse 45, having a voltage intensity denoted by Vr (see FIG. 6), is applied. Said reverse negative bias short pulse 45 accelerates the secondary electrons SE and other electrons in the vicinity of the electrode 10 into the luminescent region and, by consequence, further increases the rate of plasma ionization; and 3—A sequence of at least two short, high power, positive bias pulses 30 separated by a zero voltage time interval 50, followed by a negative bias pulse 40. In that configuration, a short time interval between the high power positive bias pulses 30, allows the secondary electrons SE, generated during the first positive bias pulse 30, to reach the luminescent region of the plasma without being decelerated by the electric field E1. This occurs because the electric field is zero in the interval between the two pulses of positive polarization 30.

In this way, it is possible to control the generation of positive ions PI (by electronic impact) allowing to amplify the density of the plasma by a factor up to tens of times.

Other combinations with variances of the intensity and configuration of the short positive and long negative polarization pulses can be constructed, where it is possible to provide a plasma with desired characteristics (such as temperature, ionization rate, chemical reactivity, volume, etc.) to a given application.

Although FIGS. 1, 2A, 3A, 4A, 5, 6 and 7 illustrate (ideally) the positive and negative polarization pulses, by means of schematic graphic representations with rectangular waveforms, with rectilinear boundaries, it should be understood that disturbances and non-linearities may occur due to the parasitic inductances and capacitances of the cables and the electric supply circuit, which may generate distortions in these pulses.

Thus, the plasma generated has the following characteristics: it can have high intensity (large quantity of ions and electrons), being possible to achieve a substantial increase in the density of the plasma, of up to 1000% in relation to continuous DC or pulsed DC plasmas; high stability, with suppression of voltaic arcs; it can be produced over a wide working gas pressure range, from 10-3 Torr up to ambient pressure (760 Torr); the volume of the plasma's luminescent region can be controlled by the adjustment of the positive short pulses (since the volume can be restricted by the contour of the electrode or fill up the entire volume of the discharge chamber), and may be produced in a liquid medium; it can be maintained with negative pulses in a wide range of electrical voltage values (from tens of volts up to thousands of volts). This allows an extensive power control, controlling the energy and ion density, allowing better plasma fit for different technological applications; and has flexibility to adjust parameters of the plasma, broadening its spectrum of technological applications.

The method in question is based on the different physical properties of electrons and ions: these particles have the same value of electric charge, but with opposite signals (charge=$1.6\times10^{-19}$ C; positive for the ion and negative for the electron). However, the mass of the electron is much smaller than the mass of the ion, for example, the ratio between the mass of an electron and the mass of an argon ion is approximately $(m_e/m_{Ar})=9.11\times10^{-31}$ kg/$6.65\times10^{-26}$ Kg=$1.37\times10^{-5}$. Because of their tiny inertia, the electrons undergo much greater acceleration than the ions when subjected to an electric field (electric potential difference $\Delta V$), since the acceleration can be calculated by the equation:

$$a=1/m(e\cdot\Delta V)/x$$

Where, "a" is the acceleration, "e" is the elementary electric charge (charge of an electron), $\Delta V$ is the electric potential drop in the electrode sheath (sheath is the space between the surface of the electrode and the plasma's luminescent region), and "x" is the thickness of the sheath (note: this equation is valid only for the ideal case, when there are no collisions between the particles).

Thus, the short-duration positive bias pulse (for example, half microsecond) has sufficient time interval to promote electronic bombardment (primary electrons PE from the luminescent region and the sheath) over the electrode 10 and, consequently, significantly increase the emission rate of secondary electrons SE. In this time interval, the velocity of the positive ions PI is less affected, so that the plasma ion velocity distribution does not undergo significant changes. Therefore, in this time interval, a large production of secondary electrons SE occurs without significantly affecting the ion speed distribution. Another factor that makes the emission of secondary electrons SE more efficient when bombardment is done with other electrons is that the transfer of linear momentum is maximized when the collision occurs between bodies with equal masses. Therefore, the electron-electron collision is much more efficient (than the ion-electron collision) for momentum transfer and hence for the ejection of electrons from the surface.

After the emission of the secondary electrons, they are accelerated by the field E2 (due to inversion of polarity), pushed to the luminescent region with high energy. As a consequence, denser plasma with a higher density of positive ions PI and derived electrons is obtained. The degree of ionization, temperature and volume of the plasma (luminescence region volume) can be easily controlled by the intensity, duration and sequence of positive bias pulses 30. In addition, the positive bias pulses 30 interspersed with negative bias pulses act very efficiently in suppressing voltaic arcs between the electrodes.

The invention claimed is:

1. A plasma densification method for plasma of the type formed between electrodes to be energized by an electric power source, said plasma being of the type containing a partially ionized mass having a region of luminescence, neutral atoms of an ionizable fluid, primary electrons, positive ions and negative ions, the method comprising the following steps:

accelerating the primary electrons contained in the partially ionized mass towards a surface of one of said electrodes by applying a positive high voltage pulse to said one of said electrodes such that at least part of the primary electrons impact against the surface of said one of said electrodes and eject secondary electrons;

accelerating the secondary electrons and any other electrons in the vicinity of said one of said electrodes toward the luminescence region by biasing said one of said electrodes with a negative voltage bias pulse such that the secondary electrons and any other electrons collide with neutral atoms and produce positive ions and derived electrons, wherein the positive high voltage pulse and the negative voltage bias pulse each comprise a width and an amplitude, the positive high voltage pulse width is smaller than the negative voltage bias pulse width and the positive high voltage pulse amplitude is greater than the negative voltage bias pulse amplitude; and continuously repeating the steps of accelerating the primary electrons contained in the partially ionized mass towards the surface of one of said electrodes by applying the positive high voltage pulse to said one of said electrodes and accelerating the secondary electrons and any other electrons in the vicinity of said one of said electrodes toward the luminescence region by biasing said one of said electrodes with the negative voltage bias in order to generate a stable plasma in steady state with a desired degree of plasma density, wherein a degree of ionization is controlled by the width and amplitude of the applied positive high voltage pulse and the negative voltage bias pulse.

2. A method according to claim 1, wherein the positive high voltage pulse has a predetermined width and amplitude to kinetically energize at least part of the primary electrons from the partially ionized mass and collide the primary electrons with said one of said electrodes without increasing the kinetic energy of the positive ions and moving the positive ions away from a region in which the positive ions are in the partially ionized mass and keeping the positive ions near said one of said electrodes.

3. A method according to claim 2, wherein the amplitude of the positive high voltage pulse is in a range of hundreds of volts up to thousands of volts and the width of the positive high voltage pulse is in a range of nanoseconds up to tens of microseconds.

4. A method according to claim 1, wherein the negative voltage bias pulse has a predetermined width and amplitude to kinetically energize the secondary electrons ejected from said one of said electrodes and any other electrons in the vicinity of the luminescence region of the plasma to produce positive ions and derived electrons by collision with neutral atoms in the luminescence region.

5. A method according to claim 4, wherein the amplitude of the negative voltage bias pulse is in a range of tens of volts up to hundreds of volts, and the width of the negative voltage bias pulse is in a range of microseconds and greater than the width of the positive high voltage pulse.

6. A method according to claim 4, wherein the negative voltage bias pulse has the predetermined width to accelerate the positive ions produced in the region of plasma luminescence toward the electrodes to promote ionic bombardment of the positive ions against said one of said electrodes.

7. A method according to claim 1, wherein any one of the positive or negative bias pulses is initiated at the end of a previous positive or negative bias pulse.

8. A method according to claim 7, further comprising two or more subsequent positive high voltage pulses, wherein between each two adjacent of the two or more subsequent positive high voltage pulses an intermediate negative bias pulse is provided having a duration time similar to that of each of said two or more subsequent positive high voltage pulses.

9. A method according to claim 8, wherein the positive high voltage pulses, the intermediate negative bias pulses and the negative voltage bias pulses are interleaved with a null time interval between them.

10. A method according to claim 7, further comprising two or more subsequent positive high voltage pulses, wherein between each two positive high voltage pulses, a time interval of null voltage is provided to allow the secondary electrons ejected from said one of said electrodes during the immediately preceding positive high voltage pulse to reach the partially ionized mass without significant deceleration.

11. A method according to claim 1, wherein said one of said electrodes is contained in a reaction chamber containing the partially ionized mass defined in a gaseous or liquid medium.

12. A method according to claim 1, wherein the amplitude of the positive high voltage pulse and/or the negative voltage bias pulse is adjustable in bipolar form.

13. A plasma densification method for plasma of the type formed between electrodes to be energized by an electric power source, said plasma being of the type containing a partially ionized mass having a region of luminescence, and neutral atoms of an ionizable fluid, primary electrons, positive ions and negative ions; the method comprising the following steps:

accelerating the primary electrons contained in the partially ionized mass towards a surface of one of said electrodes by means of a positive high voltage pulse applied to said one of said electrodes with energy to impact at least part of the primary electrons against the surface of said one of said electrodes and to eject secondary electrons, the positive high voltage pulse comprising two or more subsequent positive high voltage pulses, wherein between each two adjacent of the two or more subsequent positive high voltage pulses an intermediate negative voltage bias pulse is provided, each of the two or more subsequent positive high voltage pulses and the intermediate negative voltage bias pulse having a same pulse width;

accelerating the secondary electrons and any other electrons in the vicinity of said one of said electrodes toward the luminescence region by biasing said one of said electrodes with a negative voltage bias pulse with energy to collide them with neutral atoms and produce positive ions and derived electrons, the positive high voltage pulse and the negative voltage bias pulse each having a width and an amplitude, the positive high voltage pulse width being smaller than the negative voltage bias pulse width and the amplitude of the positive high voltage pulse being greater than the amplitude of the negative voltage bias pulse; and continuously repeating the steps of accelerating the primary electrons and accelerating the secondary electrons and any other electrons by said one of said electrodes with positive and negative bias pulses in order to generate a stable plasma in steady state with a desired degree of plasma density, whose degree of ionization is controlled by the width and amplitude of the applied voltage pulses, wherein any of the positive or negative bias pulses is initiated at the end of the other pulse.

14. A method according to claim 13, wherein each of the two or more subsequent positive high voltage pulses, the intermediate negative bias pulses and the negative voltage bias pulses are interleaved with a null time interval between them.

15. A method according to claim 13, wherein the amplitude of the positive high voltage pulse and/or the negative voltage bias pulse is adjustable in bipolar form.

16. A method according to claim 13, wherein the positive high voltage pulse has a predetermined width and amplitude to kinetically energize at least part of the primary electrons from the partially ionized mass and collide them with said one of said electrodes without increasing the kinetic energy of the positive ions and moving them away from a region in which they are in the partially ionized mass and keeping them near said one of said electrodes.

17. A method according to claim 16, wherein the amplitude of the positive high voltage pulse has a range of hundreds of volts up to thousands of volts and the width of the positive high voltage pulse has a range of nanoseconds up to tens of microseconds.

18. A method according to claim 13, wherein the negative voltage bias pulse has a predetermined width and amplitude to kinetically energize the secondary electrons ejected from said one of said electrodes and any other electrons in the region of luminescence of the plasma, producing positive ions and derived electrons by collision with neutral atoms in the luminescence region.

19. A method according to claim 18, wherein the amplitude of the negative voltage bias pulse has a range of tens of volts up to hundreds of volts, and the width of the negative voltage bias pulse has a range of microseconds and is greater than the width of the positive high voltage pulse.

20. A method according to claim 18, wherein the negative voltage bias pulse has the predetermined width to accelerate the positive ions produced in the region of plasma luminescence toward the electrodes promoting ionic bombardment of the positive ions against said one of said electrodes.

* * * * *